US012771313B2

(12) United States Patent
Kyouya

(10) Patent No.: US 12,771,313 B2
(45) Date of Patent: Oct. 20, 2026

(54) ACOUSTIC WAVE DEVICE

(71) Applicant: Murata Manufacturing Co., Ltd., Nagaokakyo (JP)

(72) Inventor: Haruki Kyouya, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 42 days.

(21) Appl. No.: 18/420,927

(22) Filed: Jan. 24, 2024

(65) Prior Publication Data

US 2024/0162883 A1 May 16, 2024

Related U.S. Application Data

(63) Continuation of application No. PCT/JP2022/038718, filed on Oct. 18, 2022.

(30) Foreign Application Priority Data

Oct. 26, 2021 (JP) ................................ 2021-174631

(51) Int. Cl.
*H03H 9/13* (2006.01)
*H03H 9/02* (2006.01)
*H10N 30/87* (2023.01)

(52) U.S. Cl.
CPC ........ *H03H 9/131* (2013.01); *H03H 9/02228* (2013.01); *H03H 9/02992* (2013.01); *H10N 30/877* (2023.02)

(58) Field of Classification Search
CPC ........... H03H 9/02574; H03H 9/02559; H03H 9/02992; H03H 9/25; H03H 9/02866; H03H 9/02228; H03H 9/6483; H03H 9/1457; H03H 9/14541; H03H 9/02015; H03H 9/02637; H03H 9/145; H03H 9/131; H03H 9/725; H03H 9/02622; H03H 9/17;

(Continued)

(56) References Cited

U.S. PATENT DOCUMENTS 12,149,226 B2 * 11/2024 Taniguchi .......... H03H 9/02992
2007/0222335 A1 9/2007 Nakano et al.

(Continued)

FOREIGN PATENT DOCUMENTS

CN 104205633 B 10/2016
CN 107567682 B 1/2021

(Continued)

OTHER PUBLICATIONS

International Search Report in PCT/JP2022/038718, mailed Jan. 17, 2023, 3 pages.

(Continued)

*Primary Examiner* — Taelor Kim
*Assistant Examiner* — Tyler J Pereny
(74) *Attorney, Agent, or Firm* — Keating & Bennett, LLP

(57) ABSTRACT

An acoustic wave device in which a piezoelectric film is directly or indirectly laminated on a support substrate, a first Interdigital Transducer (IDT) electrode, on a first main surface of the piezoelectric film, and a second IDT electrode on a second main surface, are provided. One of the first IDT electrode and the second IDT electrode is made of an epitaxial film and another of the first IDT electrode and the second IDT electrode is made of a non-epitaxial film.

20 Claims, 4 Drawing Sheets

(58) Field of Classification Search
CPC ........... H03H 9/02007; H03H 9/02834; H03H 9/14544; H03H 9/568; H03H 9/6496; H03F 3/195; H03F 3/245; H03F 2200/451; H03F 2200/111; H03F 3/19
See application file for complete search history.

(56) References Cited

U.S. PATENT DOCUMENTS

| | | | | |
|---|---|---|---|---|
| 2008/0106354 | A1* | 5/2008 | Kando | H03H 9/02228 333/193 |
| 2011/0102108 | A1 | 5/2011 | Fukuda | |
| 2013/0093538 | A1* | 4/2013 | Hirota | H03H 9/02574 333/195 |
| 2014/0368296 | A1* | 12/2014 | Nishizawa | H03H 9/08 333/195 |
| 2015/0028966 | A1* | 1/2015 | Iwamoto | H03H 9/725 333/133 |
| 2016/0182007 | A1* | 6/2016 | Bhattacharjee | H03H 3/02 29/25.35 |
| 2018/0019832 | A1 | 1/2018 | Okuda | |
| 2022/0416764 | A1 | 12/2022 | Nakagawa et al. | |

FOREIGN PATENT DOCUMENTS

| | | | |
|---|---|---|---|
| JP | 2007288764 | A | 11/2007 |
| JP | 2018011280 | A | 1/2018 |
| JP | 2018506930 | A | 3/2018 |
| JP | 2018195936 | A | 12/2018 |
| WO | 2007007462 | A1 | 1/2007 |
| WO | 2009150786 | A1 | 12/2009 |
| WO | 2021187200 | A1 | 9/2021 |

OTHER PUBLICATIONS

Written Opinion in PCT/JP2022/038718, mailed Jan. 17, 2023, 5 pages.

Official Communication issued in corresponding Chinese Patent Application No. 202280051792.8, mailed on Jul. 1, 2026, 9 pages.

* cited by examiner

ACOUSTIC WAVE DEVICE

CROSS REFERENCE TO RELATED APPLICATIONS

This application claims the benefit of priority to Japanese Patent Application No. 2021-174631, filed on Oct. 26, 2021, and is a Continuation Application of PCT Application No. PCT/JP2022/038718, filed on Oct. 18, 2022. The entire contents of each application are hereby incorporated herein by reference.

BACKGROUND OF THE INVENTION

1. Field of the Invention

The present invention relates to acoustic wave devices that include a piezoelectric film, which is directly or indirectly laminated on a support substrate, and Interdigital Transducer (IDT) electrodes, which are provided on both respective surfaces of the piezoelectric film.

2. Description of the Related Art

International Publication No. 2021/187200 discloses an acoustic wave device that includes an IDT electrode, which defines a first resonator, and another IDT electrode, which defines a second resonator, on one main surface of a piezoelectric substrate. The IDT electrode of the first resonator is composed of an epitaxial film and the IDT electrode of the second resonator has an electrode layer composed of a non-epitaxial film.

The acoustic wave device described in International Publication No. 2021/187200 is provided with the first resonator and the second resonator that respectively have the IDT electrode using an epitaxial film and the IDT electrode composed of a non-epitaxial film. Accordingly, when a band pass filter including the first resonator and the second resonator is configured, linearity can be improved.

In International Publication No. 2021/187200, the IDT electrode defining the first resonator and the IDT electrode defining the second resonator are configured on one main surface of the piezoelectric substrate. This increases an IDT electrode forming region. Thus, there has been a problem in that miniaturization is difficult.

SUMMARY OF THE INVENTION

Example embodiments of the present invention provide an acoustic wave devices each of which are able to improve linearity while also achieving miniaturization.

An acoustic wave device according to an example embodiment of the present invention includes a support substrate, a piezoelectric film that includes a first main surface and a second main surface, which are opposed to each other, and is directly or indirectly laminated on the support substrate from a side of the second main surface, and a first Interdigital Transducer (IDT) electrode and a second IDT electrode that are provided on the first main surface and the second main surface of the piezoelectric film respectively. One of the first IDT electrode and the second IDT electrode includes an epitaxial film and another of the first IDT electrode and the second IDT electrode includes a non-epitaxial film.

According to example embodiments of the present invention, it is possible to provide acoustic wave devices in each of which not only linearity is improved but also miniaturization is achieved.

The above and other elements, features, steps, characteristics and advantages of the present invention will become more apparent from the following detailed description of the example embodiments with reference to the attached drawings.

DETAILED DESCRIPTION OF THE EXAMPLE EMBODIMENTS

The present invention will be clarified below by describing specific example embodiments of the present invention with reference to the accompanying drawings.

Each of the example embodiments described in this specification is exemplary and configurations can be partially exchanged or combined with each other between different example embodiments.

Figure 1:
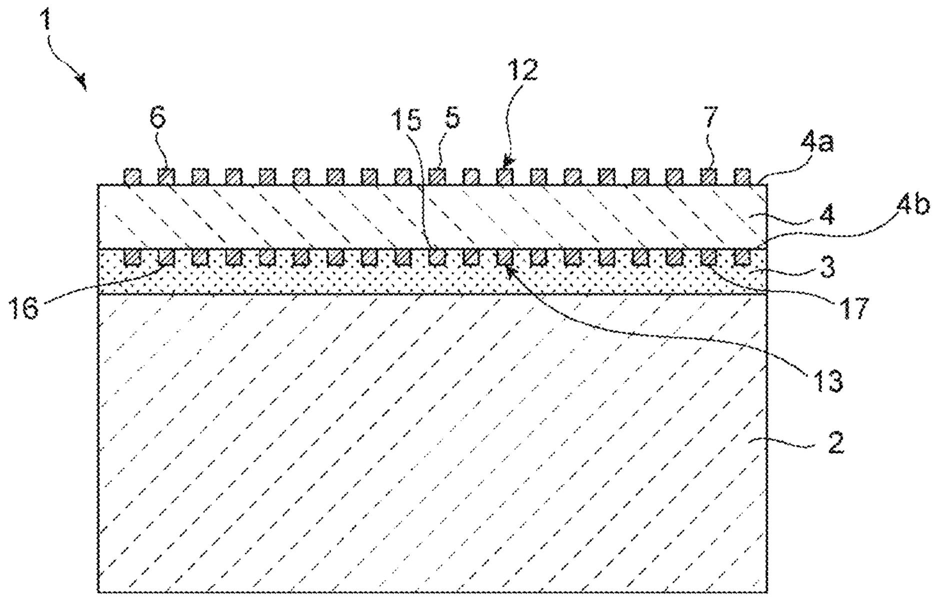
FIG. 1 is a front sectional view of an acoustic wave device according to a first example embodiment of the present invention.
Figure 2:
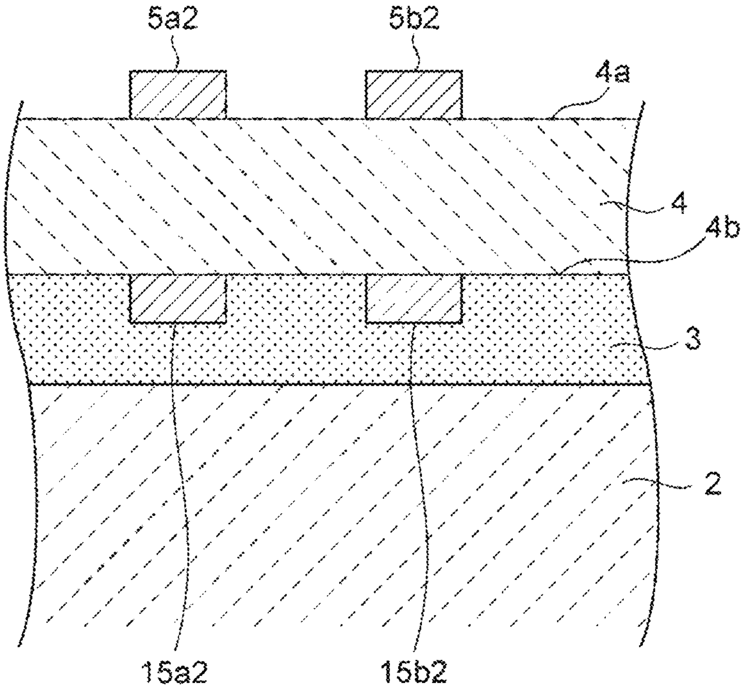
FIG. 2 is a partial-cutout front sectional view explaining chief portions of the acoustic wave device according to the first example embodiment of the present invention.
Figure 3:
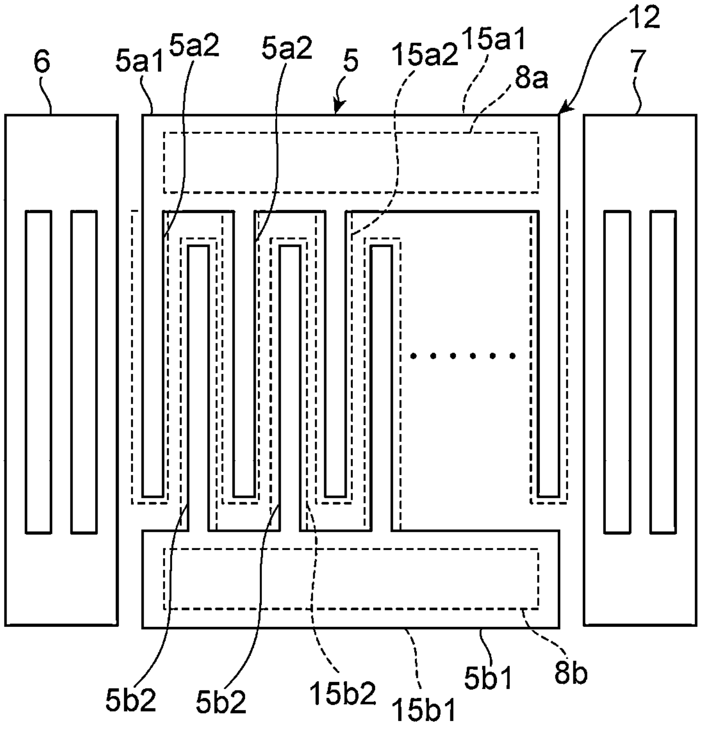
FIG. 3 is a plan view explaining an electrode structure of the acoustic wave device according to the first example embodiment of the present invention.

FIG. 1 is a front sectional view of an acoustic wave device according to a first example embodiment of the present invention, FIG. 2 is a partial-cutout front sectional view explaining chief portions of the acoustic wave device, and FIG. 3 is a plan view explaining an electrode structure of the same.

In an acoustic wave device 1, a piezoelectric film 4 is indirectly laminated on a support substrate 2. Namely, a dielectric film 3 is provided between the support substrate 2 and the piezoelectric film 4. Here, the piezoelectric film 4 may be directly laminated on the support substrate 2.

The piezoelectric film 4 includes a first main surface 4*a* and a second main surface 4*b* that are opposed to each other. The piezoelectric film 4 is made of, for example, $LiTaO_3$. However, not limited to lithium tantalate, the piezoelectric film 4 can be made of any piezoelectric single crystal such as, for example, lithium niobate.

The dielectric film 3 is preferably, for example, a silicon oxide film. However, the material of the dielectric film 3 is not limited to silicon oxide and may be, for example, silicon nitride, silicon oxynitride, lithium oxide, tantalum pentoxide, or the like.

On the first main surface 4*a* of the piezoelectric film 4, a first IDT electrode 5 is provided. Reflectors 6 and 7 are provided on both respective sides in an acoustic wave propagating direction of the first IDT electrode 5. In a similar manner, on the second main surface 4*b* of the piezoelectric film 4, a second IDT electrode 15 is provided and reflectors 16 and 17 are provided on both respective sides in an acoustic wave propagating direction of the second IDT electrode 15.

On the first main surface 4*a* of the piezoelectric film 4, a first surface acoustic wave resonator 12, which includes the first IDT electrode 5 and the reflectors 6 and 7, is provided. On the second main surface 4*b* of the piezoelectric film 4, a second surface acoustic wave resonator 13, which includes the second IDT electrode 15 and the reflectors 16 and 17, is provided.

As illustrated in FIG. 3, the first IDT electrode 5 of the first surface acoustic wave resonator 12 includes a first busbar Sal and a second busbar 5*b*1, which are opposed to each other. A plurality of first electrode fingers 5*a*2 are connected to the first busbar Sal. A plurality of second electrode fingers 5*b*2 are connected to the second busbar 5*b*1. The plurality of first electrode fingers 5*a*2 and the plurality of second electrode fingers 5*b*2 are interdigitated.

The acoustic wave propagating direction is a direction that is orthogonal or substantially orthogonal to extending directions of the first electrode fingers 5*a*2 and the second electrode fingers 5*b*2. A region in which the first electrode fingers 5*a*2 and the second electrode fingers 5*b*2 overlap with each other in the acoustic wave propagation direction is an intersecting region.

The second IDT electrode 15 also preferably has the same or similar structure. Namely, a third busbar 15*a*1, third electrode fingers 15*a*2, a fourth busbar 15*b*1, and fourth electrode fingers 15*b*2 are provided.

Connection electrodes 8*a* and 8*b* are connected to the first busbar Sal and the second busbar 5*b*1 respectively. The connection electrodes 8*a* and 8*b* penetrate through the piezoelectric film 4 and are connected with the third busbar 15*a*1 and the fourth busbar 15*b*1 of the second IDT electrode 15 respectively.

The connection electrodes 8*a* and 8*b* connect the first IDT electrode 5 and the second IDT electrode 15 in parallel. That is, the first surface acoustic wave resonator 12 and the second surface acoustic wave resonator 13 are connected in parallel in the acoustic wave device 1.

The first surface acoustic wave resonator 12 and the second surface acoustic wave resonator 13 are connected in parallel and are provided on the first main surface 4*a* side and the second main surface 4*b* side of the piezoelectric film 4 respectively, in the acoustic wave device 1. Thus, installation space for each IDT electrode can be reduced in size, being able to achieve miniaturization.

In addition, the first IDT electrode 5 includes an electrode layer made of an epitaxial film, as a main electrode layer. Here, the main electrode layer is an electrode layer that dominantly acts when operating as a surface acoustic wave resonator.

A main electrode layer of the second IDT electrode 15 is preferably made of a non-epitaxial film. That is, an electrode layer preferably made of a non-epitaxial film defines the main electrode layer. Further, the second IDT electrode 15 and the reflectors 16 and 17 are embedded in the dielectric film 3.

The main electrode layer of the first IDT electrode 5 is preferably made of an epitaxial film, and the material thereof may be various metals and alloys such as, for example, Al and AlCu alloys and is not particularly limited.

In an acoustic wave device, electric power handling capability of an IDT electrode made of a non-epitaxial film is lower than that of an IDT electrode made of an epitaxial film. However, in the acoustic wave device 1, the second IDT electrode 15 having lower electric power handling capability is embedded in the dielectric film 3. This can increase the electric power handling capability.

The main electrode layer of the second IDT electrode 15 is preferably made of a metal or alloy, such as, for example, Pt or Ti, which has higher density than Al, AlCu alloy, or the like. In this configuration, a reflection coefficient can be increased and degradation in characteristics can be reduced or prevented. The reflection coefficient may be lowered when the second IDT electrode 15 is embedded in the dielectric film 3 that is a silicon oxide film. However, degradation in characteristics can be reduced or prevented by increasing the reflection coefficient with the use of a metal or alloy having higher density.

The second IDT electrode 15 is preferably made of a non-epitaxial film and the electric power handling capability thereof is therefore lower than that of an epitaxial film. Accordingly, when the main electrode layers of the first and second IDT electrodes 5 and 15 are made of, for example, an AlCu alloy, it is preferable that Cu concentration in the second IDT electrode 15 is higher than Cu concentration in the first IDT electrode 5.

Figure 4:
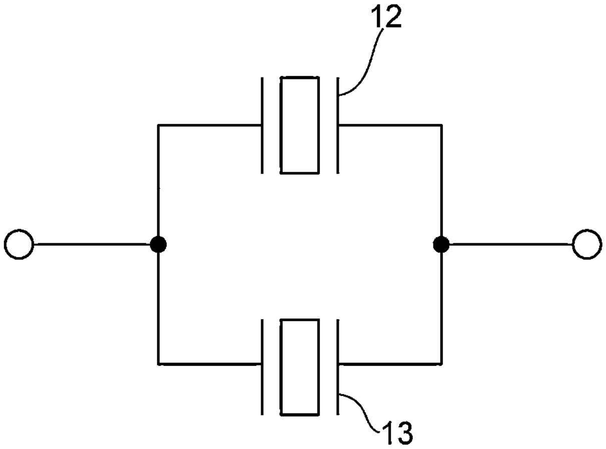
FIG. 4 is a circuit diagram illustrating a connection structure between a first surface acoustic wave resonator and a second surface acoustic wave resonator of the acoustic wave device according to the first example embodiment of the present invention.

As illustrated in FIG. 4, the first surface acoustic wave resonator 12 and the second surface acoustic wave resonator 13 are connected in parallel in the acoustic wave device 1. The main electrode layer of the first surface acoustic wave resonator 12 preferably includes an epitaxial film and the second surface acoustic wave resonator 13 includes the main electrode layer made of a non-epitaxial film. Accordingly, linearity can be improved as is the case with the acoustic wave device described in International Publication No. 2021/187200. In example embodiments of the present invention, one of the first and second IDT electrodes is made of an epitaxial film and the other is made of a non-epitaxial film.

Here, an epitaxial film is preferably, for example, a single crystal film in which a normal line of a crystal plane ((111) surface in use of Al, for example) of a main electrode layer is substantially accorded with a c axis of the piezoelectric film 4 and a diffraction pattern observed in an X-ray diffraction pole figure (XRD pole figure) has six-fold symmetry spots. In a non-epitaxial film, the six-fold symmetry spots do not appear in the X-ray diffraction pole figure (XRD pole figure).

Figure 5:
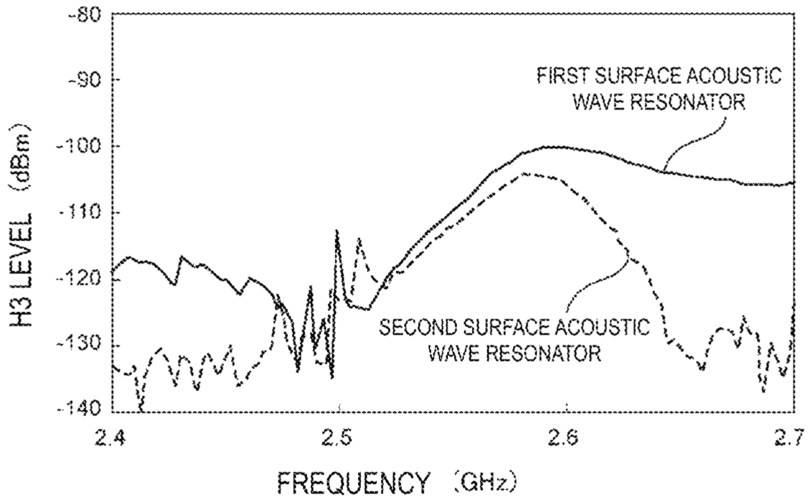
FIG. 5 is a diagram illustrating a relationship between a frequency and a third harmonic wave level of each of the first surface acoustic wave resonator and the second surface acoustic wave resonator.

The first surface acoustic wave resonator 12 and the second surface acoustic wave resonator 13 include mutually-different main electrode layers as described above and therefore, frequency dependence of a harmonic wave differs therebetween. FIG. 5 is a diagram illustrating a relationship between a frequency and a third harmonic wave level (H3 level) of each of the first surface acoustic wave resonator and the second surface acoustic wave resonator. A solid line indicates a relationship on the first surface acoustic wave resonator 12 and a dashed line indicates a relationship on the second surface acoustic wave resonator 13. Here, for example, the first and second surface acoustic wave resonators 12 and 13 are configured in a manner such that an underlying electrode layer made of a Ti film having the thickness of about 30 nm and a main electrode layer made of an Al film having the thickness of about 415 nm are laminated on the piezoelectric film 4 made of 42 degree cut $LiTaO_3$. The Al film is an epitaxial film in the first surface acoustic wave resonator 12, and the Al film is a non-epitaxial film in the second surface acoustic wave resonator 13.

Here, the epitaxial film can be formed by the method described in Japanese Unexamined Patent Application Publication No. 2002-305402, for example. That is, after pretreatment of a piezoelectric film is performed by ion etching, an underlying electrode layer made of Ti is formed. Then, a main electrode layer made of Al is formed. In this method, Al is epitaxially grown so that the (111) surface of Al crystal is orthogonal to the c axis of $LiTaO_3$ of the piezoelectric film.

On the other hand, the non-epitaxial film of the second surface acoustic wave resonator 13 can be obtained by forming a Ti film being the underlying electrode layer and an Al film being the main electrode layer, without performing the above-mentioned treatment by ion etching.

However, the methods for forming a main electrode layer composed of an epitaxial film and for forming a main electrode layer composed of a non-epitaxial film are not particularly limited.

Figure 6:
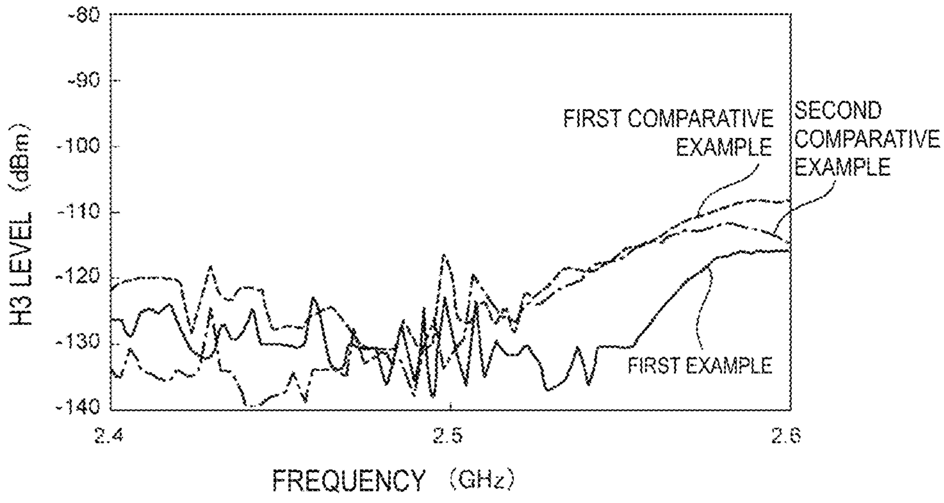
FIG. 6 is a diagram illustrating a relationship between a frequency and a third harmonic wave level in an acoustic wave device of each of a first example, a first comparative example, and a second comparative example.

FIG. 6 is a diagram illustrating a relationship between a frequency and a third harmonic wave level (H3 level) in an acoustic wave device of each of a first example according to the first example embodiment and first and second comparative examples, which will be described below. A solid line, a dashed line, and a dashed-dotted line indicate respective results of the first example, the first comparative example, and the second comparative example.

In the first example, the first surface acoustic wave resonator 12 and the second surface acoustic wave resonator 13 are connected in parallel, as illustrated in FIG. 4.

In the first comparative example, two pieces of first surface acoustic wave resonators 12 are connected in parallel.

In the second comparative example, two pieces of second surface acoustic wave resonators 13 are connected in parallel.

As can be seen from FIG. 6, according to the first example in which the first surface acoustic wave resonator 12 and the second surface acoustic wave resonator 13 are connected in parallel, the signal strength of the third harmonic wave is significantly smaller, namely by about 5 dBm to about 10 dBm, in a range from about 2.5 GHz to about 2.6 GHz inclusive, compared to the first comparative example and the second comparative example. It is considered that this is because third harmonic wave signals are canceled in the frequency band from about 2.5 GHz to about 2.6 GHz inclusive since the frequency dependence of a third harmonic wave differs between the first surface acoustic wave resonator 12 and the second surface acoustic wave resonator 13.

Thus, in the acoustic wave device 1 described above, third harmonic wave signals are canceled and linearity can be improved.

Further, in addition to the improvement of linearity, miniaturization can be achieved in the acoustic wave device 1 as described above.

Here, the material of the support substrate 2 is not particularly limited and appropriate piezoelectric materials or semiconductors can be used. The support substrate 2 is made of, for example, Si in the present example embodiment.

The support substrate 2 is preferably a high-acoustic-velocity material layer, which is made of a high-acoustic-velocity material in which an acoustic velocity of a bulk wave propagating therethrough is higher than an acoustic velocity of an acoustic wave propagating through the piezoelectric film 4. When the support substrate 2 made of a high-acoustic-velocity material is used, energy of an acoustic wave can be effectively confined in the piezoelectric film 4.

The dielectric film 3 is made of, for example, silicon oxide, in the present example embodiment. The dielectric film 3 is preferably made of a low-acoustic-velocity material in which an acoustic velocity of a bulk wave propagating therethrough is lower than an acoustic velocity of a bulk wave propagating through the piezoelectric film 4. Silicon oxide is a low-acoustic-velocity material. When the dielectric film 3 is made of a low-acoustic-velocity material and the support substrate 2 made of a high-acoustic-velocity material is provided below the dielectric film 3 made of the low-acoustic-velocity material, energy of an acoustic wave can be effectively confined by the piezoelectric film 4. Alternatively, the dielectric film 3 may be made of a high-acoustic-velocity material. The dielectric film 3, however, does not necessarily have to be provided.

Examples of the low-acoustic-velocity material mentioned above may include, for example, as well as silicon oxide, various materials such as glass, silicon oxynitride, tantalum oxide, a compound obtained by adding fluorine, carbon, boron, hydrogen, or a silanol group to silicon oxide, and a medium including the above-described material as a main component.

Examples of the high-acoustic-velocity material mentioned above may include, for example, as well as silicon, various materials such as aluminum oxide, silicon carbide, silicon nitride, silicon oxynitride, sapphire, lithium tantalate, lithium niobate, crystal, alumina, zirconia, cordierite, mullite, steatite, forsterite, magnesia, diamond-like carbon (DLC) film, or diamond, a medium including the above-described material as a main component, and a medium including a mixture of the above-described materials as a main component.

Figure 7:
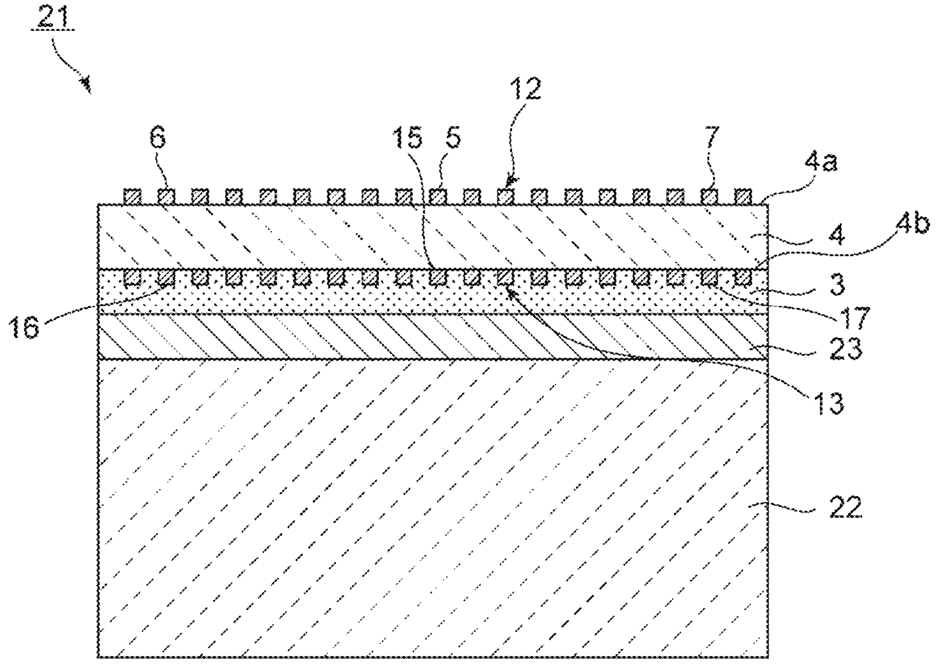
FIG. 7 is a front sectional view of an acoustic wave device according to a second example embodiment of the present invention.

FIG. 7 is a front sectional view of an acoustic wave device according to a second example embodiment of the present invention.

In an acoustic wave device 21, a high-acoustic-velocity material layer 23 is laminated between the dielectric film 3, which defines and functions as a low-acoustic-velocity material layer made of a low-acoustic-velocity material, and a support substrate 22. The high-acoustic-velocity material layer 23 is made of the high-acoustic-velocity material described above, and is made of, for example, silicon nitride in the present example embodiment.

When the dielectric film 3 is thus made of a low-acoustic-velocity material, it is preferable that the high-acoustic-velocity material layer 23 is laminated on a surface, which is opposite to a surface having the piezoelectric film 4 thereon, of the dielectric film 3. In this configuration, the support substrate 22 does not have to be made of a high-acoustic-velocity material but may be made of an appropriate insulator or semiconductor.

While example embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:

a support substrate;

a piezoelectric film including a first main surface and a second main surface, the first main surface and the second main surface being opposed to each other, and is directly or indirectly laminated on the support substrate from a side including the second main surface; and a first Interdigital Transducer (IDT) electrode and a second IDT electrode on the first main surface and the second main surface of the piezoelectric film respectively; wherein one of the first IDT electrode and the second IDT electrode is made of an epitaxial film and another of the first IDT electrode and the second IDT electrode is made of a non-epitaxial film;

the non-epitaxial film is made of a metal having higher density than a metal of the epitaxial film; and the first IDT electrode and the second IDT electrode are made of AlCu, and a Cu concentration in the second IDT electrode is higher than a Cu concentration in the first IDT electrode.

2. The acoustic wave device according to claim 1, wherein the first IDT electrode is made of the epitaxial film and the second IDT electrode is made of the non-epitaxial film.

3. The acoustic wave device according to claim 1, further comprising:

a dielectric film between the support substrate and the piezoelectric film; wherein the second IDT electrode is embedded in the dielectric film.

4. The acoustic wave device according to claim 3, wherein the dielectric film is a silicon oxide film.

5. The acoustic wave device according to claim 1, wherein the first IDT electrode and the second IDT electrode are connected in parallel.

6. The acoustic wave device according to claim 1, further comprising a high-acoustic-velocity material layer laminated between the support substrate and the piezoelectric film, and made of a high-acoustic-velocity material in which an acoustic velocity of a bulk wave propagating therethrough is higher than an acoustic velocity of an acoustic wave propagating through the piezoelectric film.

7. The acoustic wave device according to claim 1, wherein the support substrate is a high-acoustic-velocity material layer, the high-acoustic-velocity material layer being made of a high-acoustic-velocity material in which an acoustic velocity of a bulk wave propagating therethrough is higher than an acoustic velocity of an acoustic wave propagating through the piezoelectric film.

8. The acoustic wave device according to claim 6, further comprising a low-acoustic-velocity material layer laminated between the high-acoustic-velocity material layer and the piezoelectric film, and made of a low-acoustic-velocity material in which an acoustic velocity of a bulk wave propagating therethrough is lower than an acoustic velocity of a bulk wave propagating through the piezoelectric film.

9. The acoustic wave device according to claim 1, further comprising:

reflectors on two respective sides in an acoustic wave propagating direction of the first IDT electrode; and additional reflectors on two respective sides in an acoustic wave propagating direction of the second IDT electrode.

10. The acoustic wave device according to claim 1, wherein the another of the first IDT electrode and the second IDT electrode is made of only the non-epitaxial film.

11. An acoustic wave device comprising:

a support substrate;

a piezoelectric film including a first main surface and a second main surface, the first main surface and the second main surface being opposed to each other, and is directly or indirectly laminated on the support substrate from a side including the second main surface;

a first Interdigital Transducer (IDT) electrode and a second IDT electrode on the first main surface and the second main surface of the piezoelectric film respectively; and connection electrodes connecting the first IDT electrode and the second IDT electrode in parallel; wherein one of the first IDT electrode and the second IDT electrode is made of an epitaxial film and another of the first IDT electrode and the second IDT electrode is made of a non-epitaxial film.

12. The acoustic wave device according to claim 11, wherein the another of the first IDT electrode and the second IDT electrode is made of only the non-epitaxial film.

13. The acoustic wave device according to claim 11, wherein the first IDT electrode is made of the epitaxial film and the second IDT electrode is made of the non-epitaxial film.

14. The acoustic wave device according to claim 11, further comprising:

a dielectric film between the support substrate and the piezoelectric film; wherein the second IDT electrode is embedded in the dielectric film.

15. The acoustic wave device according to claim 14, wherein the dielectric film is a silicon oxide film.

16. The acoustic wave device according to claim 11, further comprising a high-acoustic-velocity material layer laminated between the support substrate and the piezoelectric film, and made of a high-acoustic-velocity material in which an acoustic velocity of a bulk wave propagating therethrough is higher than an acoustic velocity of an acoustic wave propagating through the piezoelectric film.

17. The acoustic wave device according to claim 11, wherein the support substrate is a high-acoustic-velocity material layer, the high-acoustic-velocity material layer being made of a high-acoustic-velocity material in which an acoustic velocity of a bulk wave propagating therethrough is higher than an acoustic velocity of an acoustic wave propagating through the piezoelectric film.

18. The acoustic wave device according to claim 16, further comprising a low-acoustic-velocity material layer laminated between the high-acoustic-velocity material layer and the piezoelectric film, and made of a low-acoustic-velocity material in which an acoustic velocity of a bulk wave propagating therethrough is lower than an acoustic velocity of a bulk wave propagating through the piezoelectric film.

19. The acoustic wave device according to claim 11, further comprising:

reflectors on two respective sides in an acoustic wave propagating direction of the first IDT electrode; and additional reflectors on two respective sides in an acoustic wave propagating direction of the second IDT electrode.

20. The acoustic wave device according to claim 11, wherein the non-epitaxial film is made of a metal having higher density than a metal of the epitaxial film.

* * * * *